United States Patent
Wang et al.

(10) Patent No.: US 9,668,352 B2
(45) Date of Patent: May 30, 2017

(54) METHOD OF EMBEDDING A PRE-ASSEMBLED UNIT INCLUDING A DEVICE INTO A FLEXIBLE PRINTED CIRCUIT AND CORRESPONDING ASSEMBLY

(71) Applicants: SUMITOMO ELECTRIC PRINTED CIRCUITS, INC., Koka, Shiga (JP); Power Gold LLC, Phoenix, AZ (US)

(72) Inventors: James Jen-ho Wang, Phoenix, AZ (US); Jin Joo Park, Takarazuka (JP); Masahiko Kouchi, Komaki (JP)

(73) Assignees: SUMITOMO ELECTRIC PRINTED CIRCUITS, INC., Koka-shi, Shiga (JP); Power Gold LLC, Phoenix, AZ (US)

(*) Notice: Subject to any disclaimer, the term of this patent is extended or adjusted under 35 U.S.C. 154(b) by 916 days.

(21) Appl. No.: 13/835,845

(22) Filed: Mar. 15, 2013

(65) Prior Publication Data

US 2014/0268594 A1   Sep. 18, 2014

(51) Int. Cl.
*H05K 1/16*      (2006.01)
*H05K 1/18*      (2006.01)
*H05K 1/02*      (2006.01)

(52) U.S. Cl.
CPC .......... *H05K 1/189* (2013.01); *H05K 1/183* (2013.01); *H01L 2224/83192* (2013.01);
(Continued)

(58) Field of Classification Search
CPC ...... H05K 1/183; H05K 1/189; H05K 1/0283; H05K 13/04; H05K 1/0207;
(Continued)

(56) References Cited

U.S. PATENT DOCUMENTS 5,084,407 A   1/1992   Boland et al.
5,860,585 A   1/1999   Rutledge et al.
(Continued)

FOREIGN PATENT DOCUMENTS

EP          0 137 209 A2   4/1985
KR   10-2004-0066135        7/2004
(Continued)

OTHER PUBLICATIONS

"Patent Analysis: Flexible roll-to-roll processing," Solid State Technology, LED Manufacturing, Feb. 5, 2013 (2 pages).
(Continued)

*Primary Examiner* — Angel R Estrada
(74) *Attorney, Agent, or Firm* — Drinker Biddle & Reath LLP

(57) ABSTRACT

A flexible printed circuit assembly, having a first flexible printed circuit having a first conductive layer and a device that is connected the first conductive layer; and a second flexible printed circuit having a second conductive layer, an insulating center layer, and a third conductive layer, the insulating center layer arranged in-between the second and the third conductive layers, the second conductive layer and the insulating center layer being removed to form an opening to expose an upper surface of the third conductive layer, wherein the first flexible printed circuit is arranged such that the device is accommodated inside the opening, a lower surface of the device being in thermal connection with the third conductive layer, and the first conductive layer is arranged to be in electrical connection with the second conductive layer.

5 Claims, 13 Drawing Sheets

(52) U.S. Cl.
CPC . *H05K 1/0207* (2013.01); *H05K 2201/09781* (2013.01); *H05K 2201/10681* (2013.01); *Y10T 29/49146* (2015.01)

(58) Field of Classification Search
CPC .......... H05K 2201/09781; H05K 2201/10681; H05K 1/16; Y10T 29/49146; H01L 2224/83192
USPC ........ 174/254, 255, 256, 260; 361/763, 748, 361/760, 761; 257/700, 723
See application file for complete search history.

(56) References Cited

U.S. PATENT DOCUMENTS

| | | | |
|---|---|---|---|
| 6,001,493 | A | 12/1999 | Rutledge et al. |
| 6,646,347 | B2 | 11/2003 | Mercado et al. |
| 6,790,759 | B1 | 9/2004 | Wang et al. |
| 6,888,246 | B2 | 5/2005 | Mercado et al. |
| 7,208,841 | B2 | 4/2007 | Wang et al. |
| 7,524,731 | B2 | 4/2009 | Wang |
| 7,615,866 | B2 | 11/2009 | Wang et al. |
| 7,619,297 | B2 | 11/2009 | Wang |
| 7,705,440 | B2 | 4/2010 | Wang |
| 7,868,729 | B2 | 1/2011 | Wang et al. |
| 8,153,510 | B2 | 4/2012 | Wang |
| 2003/0102563 | A1 | 6/2003 | Mercado et al. |
| 2003/0232493 | A1 | 12/2003 | Mercado et al. |
| 2005/0023680 | A1 | 2/2005 | Wang et al. |
| 2006/0108697 | A1 | 5/2006 | Wang et al. |
| 2007/0275549 | A1 | 11/2007 | Wang et al. |
| 2008/0079115 | A1 | 4/2008 | Wang |
| 2008/0230892 | A1* | 9/2008 | Chang ................ H01L 25/0657 257/700 |
| 2009/0065904 | A1 | 3/2009 | Wang |
| 2009/0152676 | A1 | 6/2009 | Wang |
| 2010/0015793 | A1 | 1/2010 | Wang et al. |
| 2010/0084175 | A1* | 4/2010 | Suzuki ................ H01L 21/4857 174/260 |
| 2010/0206619 | A1* | 8/2010 | Chen ...................... H01L 23/13 174/252 |
| 2010/0225434 | A1 | 9/2010 | Wang et al. |
| 2010/0279489 | A1 | 11/2010 | Wang |
| 2010/0301452 | A1 | 12/2010 | Wang |
| 2012/0061796 | A1 | 3/2012 | Wang |
| 2012/0320532 | A1* | 12/2012 | Wang .................... H05K 1/189 361/720 |

FOREIGN PATENT DOCUMENTS

| | | |
|---|---|---|
| KR | 10-2006-0054382 | 5/2006 |
| KR | 10-2009-0009890 | 1/2009 |
| WO | WO-03/049178 A2 | 6/2003 |
| WO | WO-2005/013319 A2 | 2/2005 |
| WO | WO-2007/140049 A2 | 12/2007 |
| WO | WO-2012/173654 A2 | 12/2012 |

OTHER PUBLICATIONS

Joachim N. Burghartz, "Flexible Silicon Chips: Thin, pliable organic semiconductors are too slow to serve in tomorrow's 3-D chips," Mar. 2013 (7 pages).
Redefining the Geometry of Light, Cooledge Lighting Brochure, www.cooledgelighting.com/sites/default/files/colledge-lighting-brochure.pdf (4 pages).
U.S. Appl. No. 61/497,472, filed Jun. 15, 2011.
U.S. Appl. No. 61/630,536.
U.S. Appl. No. 61/693,195.
U.S. Appl. No. 13/835,634, filed Mar. 15, 2013.

* cited by examiner

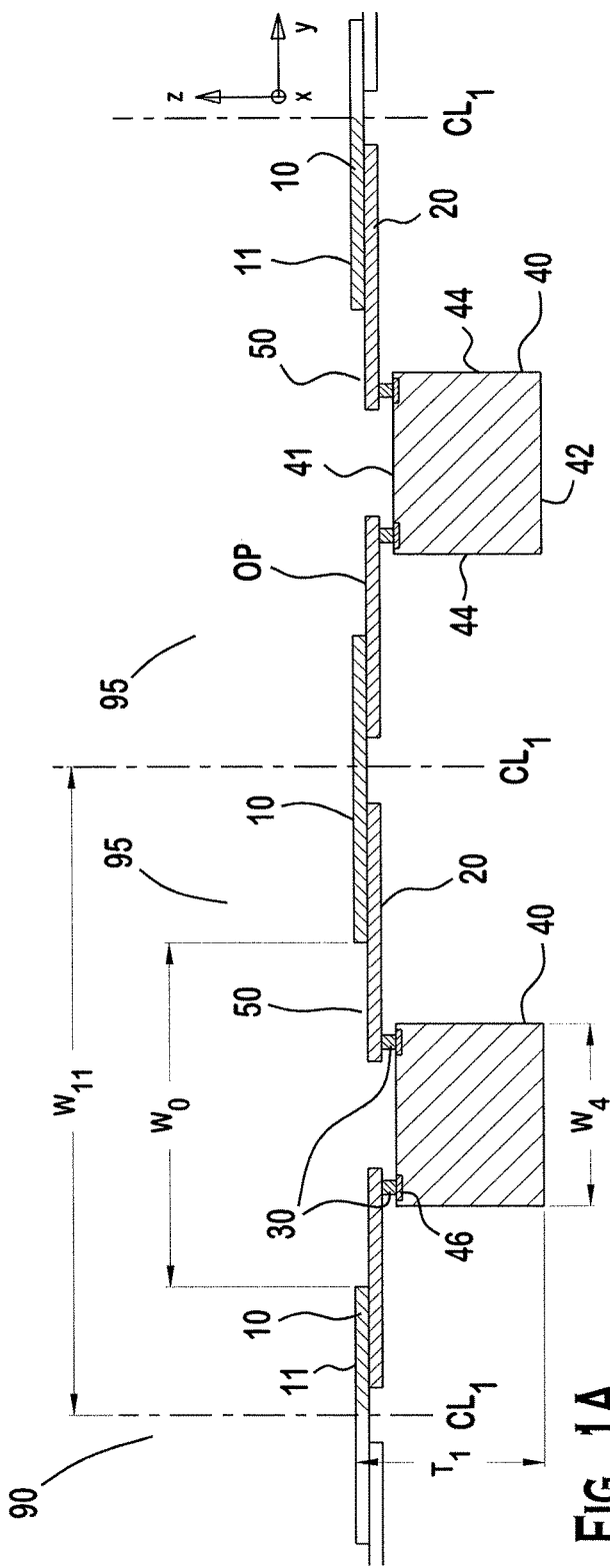
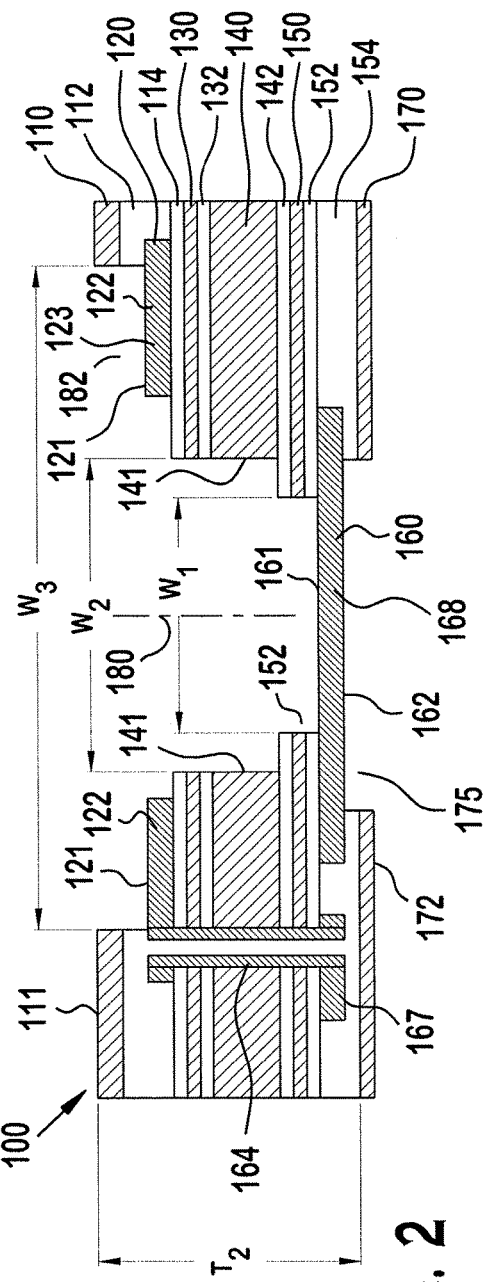
FIG. 1A
FIG. 2

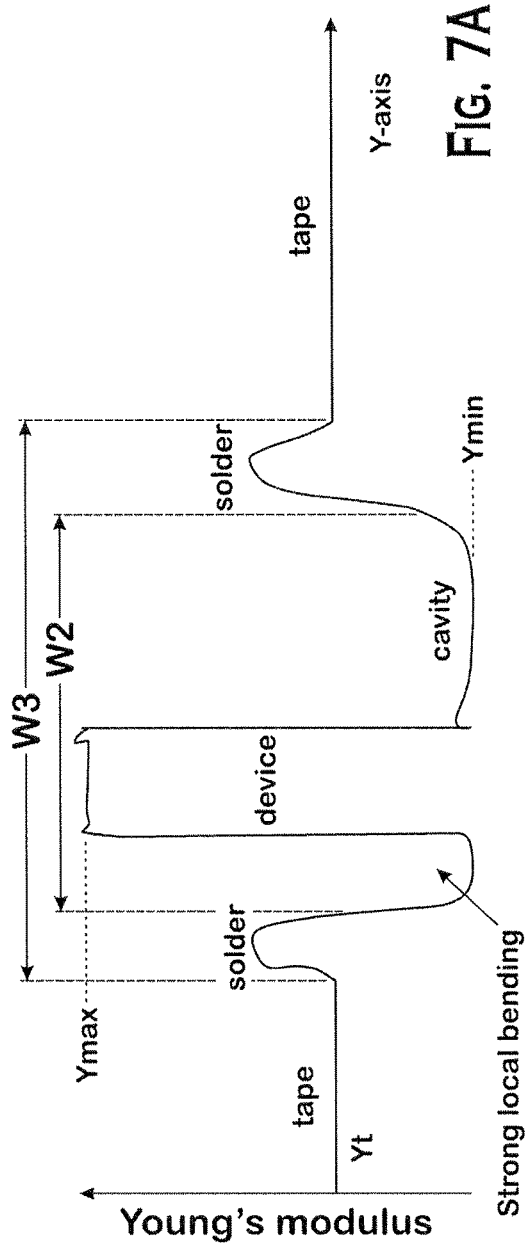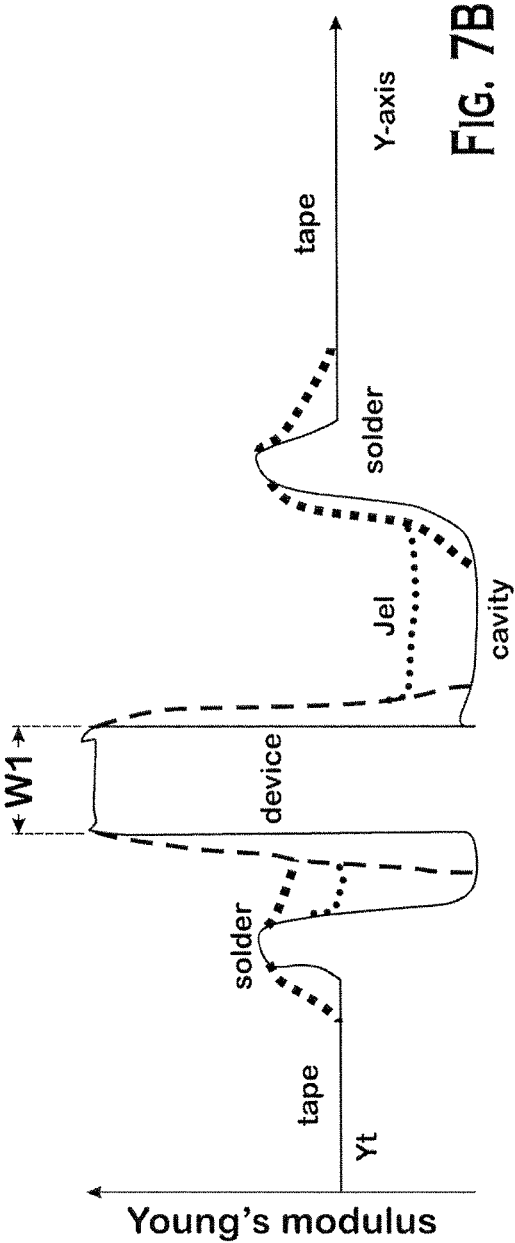

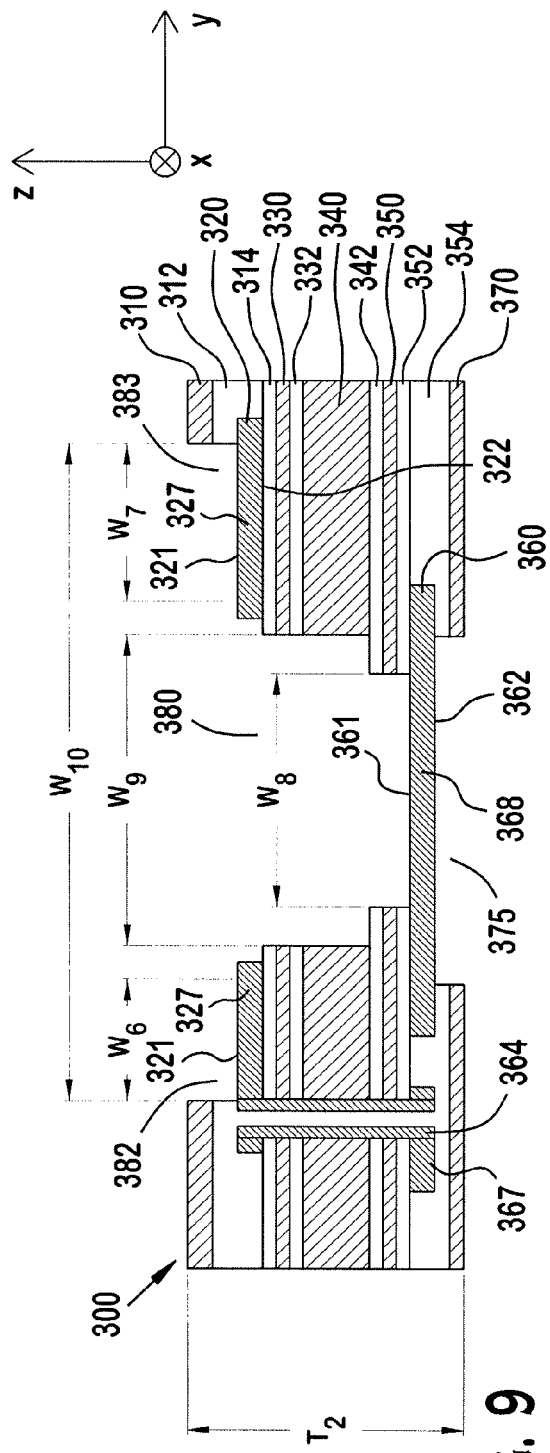
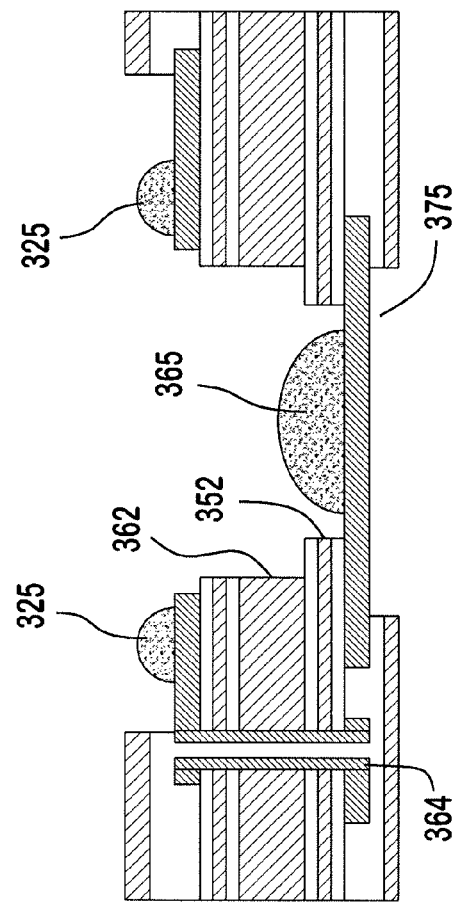
FIG. 9
FIG. 10

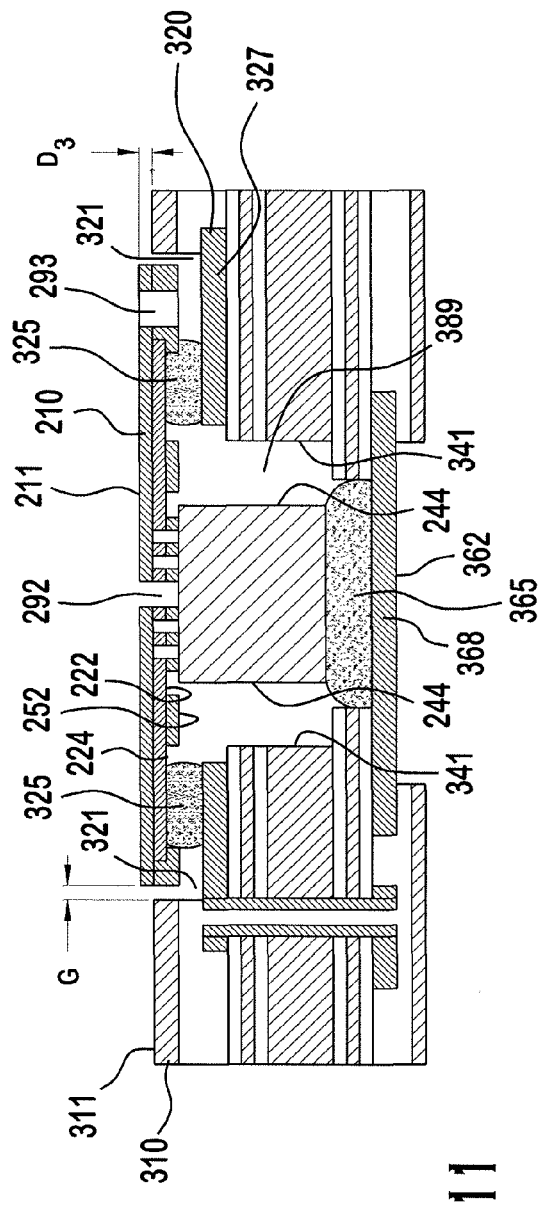
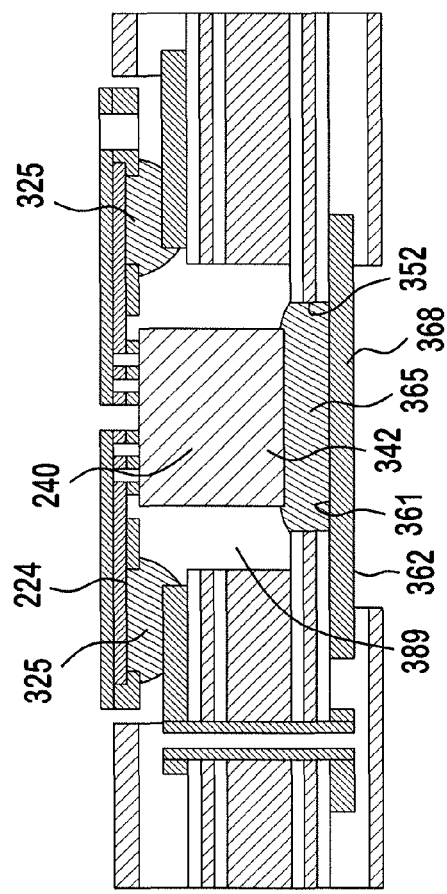
FIG. 11
FIG. 12

METHOD OF EMBEDDING A PRE-ASSEMBLED UNIT INCLUDING A DEVICE INTO A FLEXIBLE PRINTED CIRCUIT AND CORRESPONDING ASSEMBLY

TECHNICAL FIELD OF THE INVENTION

The present invention relates generally to flexible printed circuit assemblies including electronic devices and components embedded therein such that flexibility of the printed circuit of the assembly is maintained, and a method of embedding an electronic device or other component into the flexible printed circuit.

BACKGROUND OF THE INVENTION

Flexible printed circuits and rigid-flexible printed circuits are used in many applications where at least certain parts of the circuits need to be installed in a curved or bent state. Flexible printed circuits incorporate metal lines sandwiched between non-conductive flexible layers of flexible printed circuit. However, as more layers of metal and non-conductive substrates are added to the sandwich, the flexible printed circuit becomes less flexible. In addition, attempts to add electrical or electronic devices require the mounting of components onto the surfaces of the flexible circuit. The surface mounted components, i.e., surface mounted devices (SMDs), make the flexible circuit assembly even more rigid and less flexible, and substantially increase the height of the flexible circuit assembly. Technologies exist to include components inside thick, rigid glass-reinforced epoxy printed circuit boards, such as FR4, components are conventionally still mounted onto surfaces of FR4 boards and not embedded inside. Issues such as the complexity of inclusion process, high mechanical stresses, poor yield, poor thermal management, and high cost prevented inclusions of components inside FR4 for products.

Electronic systems are often partitioned onto two or three circuit boards. Rigid printed circuit boards (FR4 PCBs) are used to mount and support the electronic devices and include many copper layers to interconnect the respective SMDs. Separate flexible interconnects are used to provide interconnection between the individual rigid PCBs. Also, the flexible circuits are typically structured with two or more metal layers. Thus, the system is somewhat flexible in the interconnect flex circuit regions, but rigid where components are mounted. Bendable regions of a flex circuit generally do not contain surface mounted component because of bending stresses could be exerted on solder joints that could lead to disruptions of electrical paths. Today's multi-component system is not optimized for size and weight parameters. Furthermore, the combined PCB—flex manufacturing process is complex and expensive. Designs for flat heat sinks and bendable heat sinks are complex and limited. Rigid flex technology employs methods to thicken and stiffen a region of the flexible circuit to provide a region that is mechanically rigid to accommodate fragile components, e.g., surface mount devices and through-hole connectors. The process for inclusion of SMDs is likewise complex and less cost effective. For example, over-molding of devices such as semiconductor circuits, requires additional packaging and assembly processes. Discrete devices that are diced from a wafer to form a die are first assembled into a packaged device, and the packaged device is then mounted to a PCB to complete assembly.

In addition, the aforementioned PCB substrates are poor conductors of heat. Therefore, when heat generated by the mounted device is excessive, e.g., in the case of power circuits, microprocessors, and light-emitting devices, more expensive thermally conductive substrates accompanied with the attachment of a bulky conducting heat sink are required. The heat sink is attached to the underside of a metal core substrate, FR4 PCB, or on top of the packaged SMD to transfer heat away from the mounted device. Waste heat passes only slowly through insulating packaging materials and through circuit boards. The heat sink is typically metallic copper or aluminum and its attachment to the substrate or package makes the assembly bulky, heavy, and inflexible. Also, shielding of electronics from electromagnetic interference (EMI) conventionally require additional metal casings around FR4 PCB.

Therefore, despite all the existing flexible, rigid and FR4 PCB technologies, in light of the above deficiencies of the background technology, what is needed is an adaptable, bendable and cost-effective method of manufacturing flexible circuit assemblies that permits mounting of an increased number of devices in a cost effective weight and space saving manner, transfers heat efficiently away from heat generating devices, protect against EMI, and allows the use of highly effectual automated roll-to-roll manufacturing concepts.

SUMMARY OF EMBODIMENTS OF THE INVENTION

According to a first aspect of the present invention, a method of embedding an electronic device into a flexible pre-assembled printed circuit board is provided. Preferably, the method includes the steps of providing a flexible printed circuit having a first conductive layer, an insulating center layer, and a second conductive layer, the insulating center layer arranged in-between the first and the second conductive layers, the first conductive layer and the insulating center layer being removed at a predefined location to form an opening to expose an upper surface of the second conductive layer, and providing a pre-assembled electronic device including an electronic circuit and conductive connections that are connected to the electronic circuit. Moreover, the method further preferably includes the steps of providing a thermally conducting adhesive on the upper surface of the second conductive layer, providing a conductive material on an upper surface of the first conductive layer, placing the pre-assembled electronic device into the opening to attach a first surface of the electronic device facing the second conductive layer to the second conductive layer via the thermally conductive adhesive and to bond the conductive connections to the first conductive layer; and filling the opening with a filler material.

According to another aspect of the present invention, a method of embedding an electronic device into a flexible printed circuit board is provided. Preferably, the method includes the steps of providing a flexible printed circuit board having a first conductive layer, an insulating center layer, and a second conductive layer, the insulating center layer arranged in-between the first and the second conductive layers, the first conductive layer and the insulating center layer being removed at a predefined location to form an opening to expose an upper surface of the second conductive layer, providing a pre-assembled electronic device including a flexible substrate and an electronic device that is flip-chip bonded to the flexible substrate, and providing a thermally conducting adhesive on the upper surface of the second conductive layer. In addition, the method further preferably includes the steps of providing a conductive material on an upper surface of the first conductive layer, placing the pre-assembled electronic device into the opening to attach a first surface of the electronic device facing the second conductive layer to the second conductive layer via the thermally conductive adhesive and to connect the flexible substrate to the first conductive layer; and filling the opening with a filler material.

According to yet another aspect of the present invention, a flexible printed circuit assembly is provided. The assembly preferably includes a first flexible printed circuit having a first conductive layer and a device that is connected to conductive traces formed by the first conductive layer; and a second flexible printed circuit having a second conductive layer, an insulating center layer, and a third conductive layer, the insulating center layer arranged in-between the second and the third conductive layers, the second conductive layer and the insulating center layer being removed at a predefined location to form an opening to expose an upper surface of the third conductive layer. Moreover, in the assembly, preferably the first flexible printed circuit is arranged such that the device is accommodated inside the opening of the second flexible printed circuit, a lower surface of the device being in thermal connection with the third conductive layer, and the first conductive layer is arranged to be in electrical connection with the second conductive layer.

BRIEF DESCRIPTION OF THE SEVERAL VIEWS OF THE DRAWINGS

The accompanying drawings, which are incorporated herein and constitute part of this specification, illustrate the presently preferred embodiments of the invention, and together with the general description given above and the detailed description given below, serve to explain features of the invention.

FIG. 1A shows a side cross-sectional view and FIGS. 1B-1D show top views of a pre-assembled single-sided flexible printed circuit tape according to a first aspect of the present invention;

FIGS. 2-6 show a stages in a method for manufacturing a flexible printed circuit assembly consistent with the first aspect of the present invention;

FIGS. 7A-7B show graphs representing the stiffness profile of a tape according to FIGS. 5-6, respectively;

FIGS. 9-14 show stages in a method for manufacturing a flexible printed circuit assembly according to another aspect of the present invention.

Herein, identical reference numerals are used, where possible, to designate identical elements that are common to the figures. Also, the images in the drawings are simplified for illustration purposes and may not be depicted to scale.

DETAILED DESCRIPTION OF EMBODIMENTS OF THE INVENTION

Figure 1B:
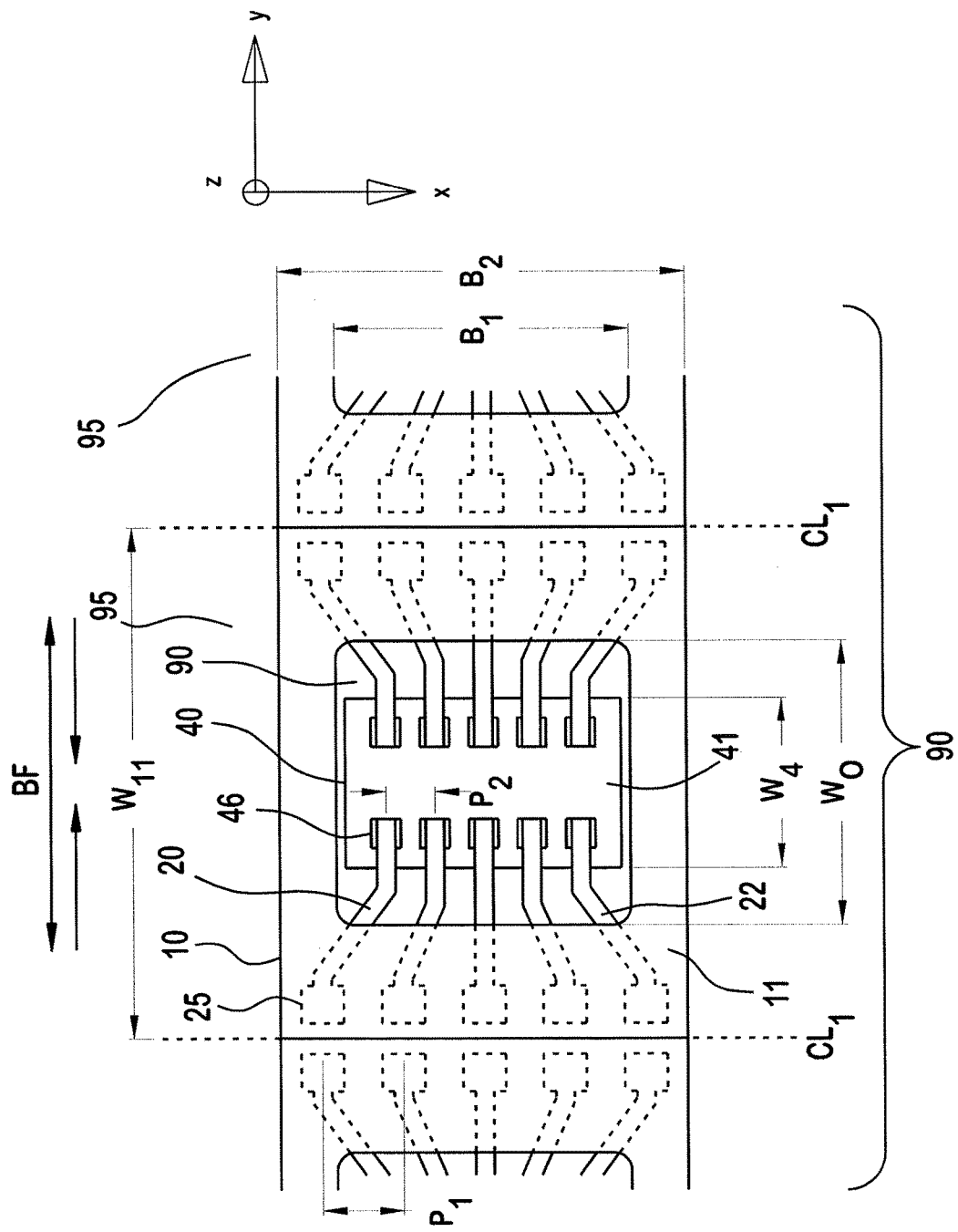
Figure 1C:
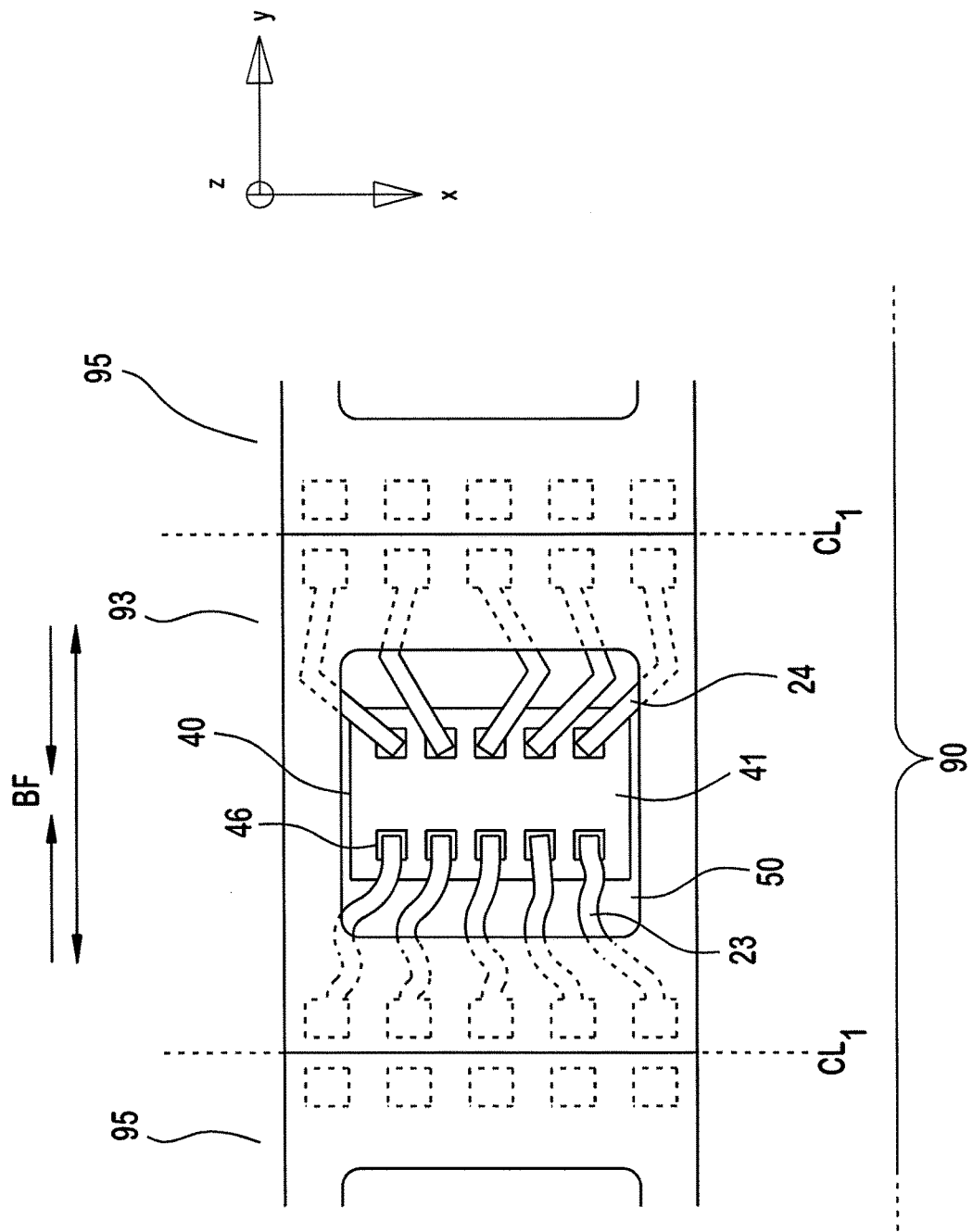
Figure 1D:
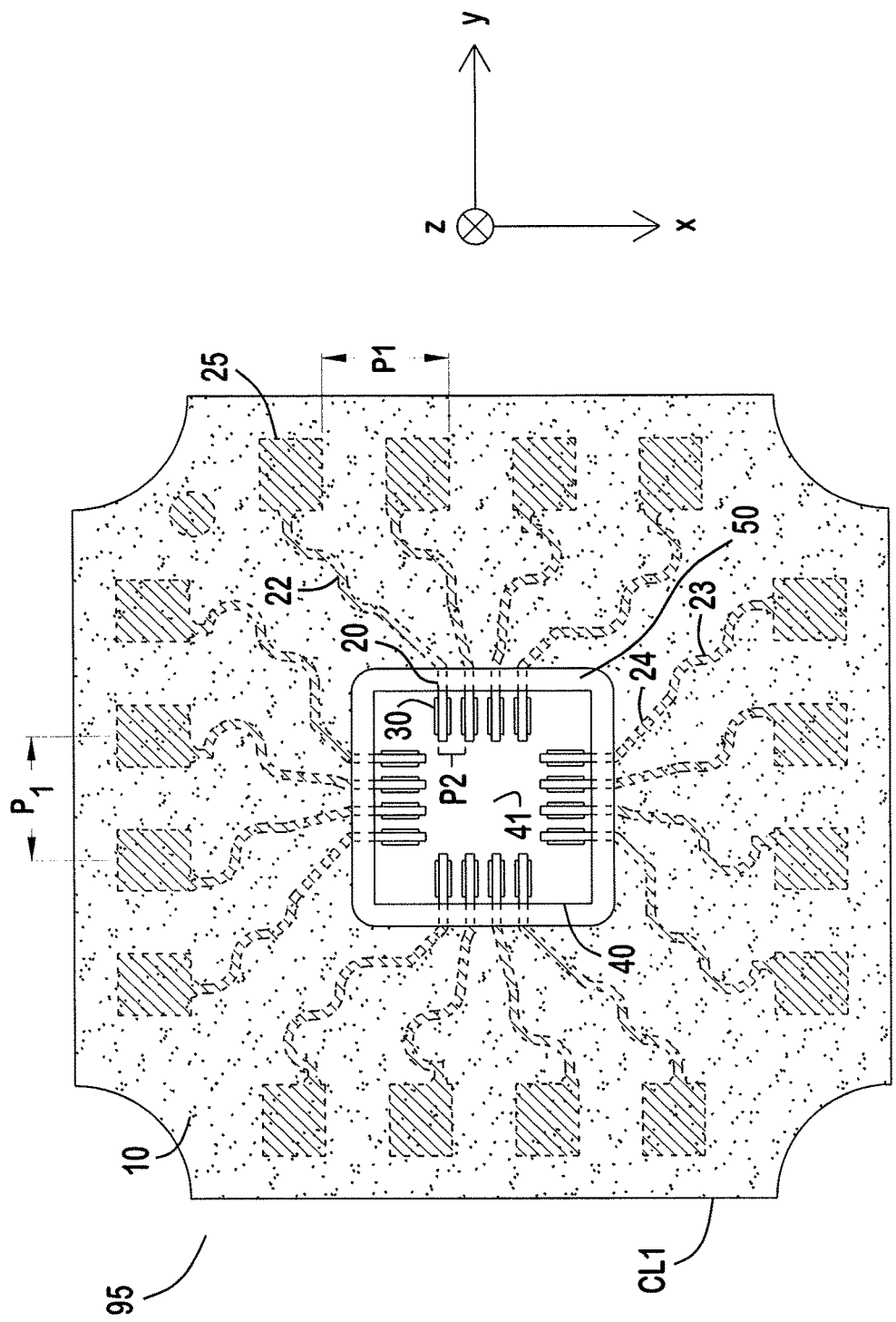

FIG. 1A shows a side cross-sectional view of flex substrate without an embedded device and FIGS. 1B-1D show top views of a pre-assembled single-sided flexible printed circuit tape 90 having two devices 40 attached thereto, and FIGS. 2-6 show stages of a method to manufacture a flexible printed circuit assembly 200. For descriptive purposes, the description below makes references to an x, y, and z Cartesian coordinate system for example as depicted in FIGS. 1A-1D for orientation and descriptive purposes only, in which the y-direction is defined by the longitudinal extension of tape 90, the x-direction the width extension of tape 90, and the z-direction is defined as being a direction that is perpendicular to an exposed surface of the first insulating layer 10 of tape 90. In this respect, the negative y-direction is referred to as the left side, while the positive y-direction is referred to as the right side, and upper and top surfaces are surfaces that are exposed towards the z-direction, while lower and bottom surfaces are surfaces that are exposed towards the negative z-direction, for descriptive purposes only. Also, the dimensions of the figures have been chosen for illustration purposes only, and may not be depicted to scale.

The flexible circuit tape 90 shown in FIGS. 1A, 1B and 1C has been previously assembled from a single-sided flexible printed circuit structure including an insulating layer 10, for example a Kapton® layer made of polyimide having a thickness of about 10 μm to 30 μm, a conductive layer 20, for example a copper (Cu) layer having a thickness of about 20 μm to 72 μm, and connection elements 30 that provide electric connection between conductive layer 20 and terminals 46 of device 40, for example gold-tin (AuSn) bond. Tape 90 can be manufactured by tape automated bonding (TAB) and next individual pre-assembled units 95 can be cut from tape 90 along cutting lines $CL_1$. Upper surface 41 of device 40 is exposed by an opening 50 that is formed in first insulating layer 10 of tape 90 having a width $W_0$. Device 40 has a width $W_4$ and is preferably an unpackaged bare die that is gold bumped for use with AuSn eutectic bonds and has not yet been previously packaged. The overall thickness $T_1$ of flexible circuit tape 90 is chosen to be less than 0.8 mm.

The pre-assembly of units 95 allows creation of an interposer structure that is able to provide flexibility and mechanical dampening by using the flexible printed circuit tape 90 that serves both as a fan-out interconnection element and as an interposer absorbing mechanical forces. Also, intermediate packaging steps for bare chips or die as devices 40 can be spared. Flexible printed circuit tape 90 can be made very thin and can be manufactured to have a very fine pitch conductive layer 20 that is improved as compared to pitches of printed circuit boards (PCB).

FIG. 1B depicts a top view in the positive z-direction of tape 90 showing device 40 and its upper surface 41. Conductive layer 20 is patterned to form individual conductive traces 22 that are connected from terminals 46 of device 40 via connection elements 30 and are attached to a lower side of insulating layer 10. Conductive traces 22 are fanned out, such that a pitch $P_1$ of the connection portions 25 of traces 22 is a larger pitch than pitch P2 of terminals 46. Also, most conductive traces 22 in FIG. 1B are not straight, but change in direction along the longitudinal extension, so that traces 22 can be subject to bending forces BF in both the positive and negative z-direction without detaching from terminals 46 and from interconnection via connection portions 25. $CL_1$ indicates each cutting line along which tape 90 can be cut to form individual pre-assembled units 95. Moreover, a variant is shown with FIG. 1C that depicts two different types of conductive traces 23 and 24, with traces 23 being curved or having a serpentine layout to avoid local bending stresses if subjected to bending forces BF that could cause breakage and to avoid sharp edges that could create strong electric fields, and with traces 24 having a single change of direction along the longitudinal expansion. Also, as shown FIG. 1B, device 40 is arranged such that the longer extension is arranged to be parallel to the x-direction, so that the narrower extension of device 40 with width $W_4$ is exposed to flexing and bending forces. In another variant shown in FIG. 1C, a device 40 is shown with terminals 46 arranged around the circumferential edge of component in lines in both the x- and the y-direction, with traces 23 having curved sections for preventing tear by potential bending stresses, and traces 24 that are angled and change the direction for fan-out purposes, but also for preventing tear due to potential bending stresses.

Width $B_2$ of tape 90 and pre-assembled unit 95, width $W_{11}$ of preassembled unit 95, widths $B_1$ and $W_0$ of opening 50, and widths $B_3$ and $W_4$ of device 40 in x-direction and y-direction, respectively of FIG. 1B have been chosen for representative purposes only, and do not necessarily correspond to real dimensions and ratios. As an example, a pre-assembled units 95 with sixteen (16) connection portions 25 can have the dimensions $B_2$ to $W_{11}$ of about 6000 µm to 6000 µm or wider, while device 40 may have the dimensions $B_3$ to $W_4$ of about 350 µm to 350 µm. Moreover, also as an example, the dimensions $B_1$ to $W_0$ of opening 50 can be about 2000 µm to 2000 µm, and therefore can be substantially larger than device 40, for easier dispensing of filler material.

As described above, the pre-assembled units 95 made of single-sided flexible printed circuit tape 90 use a direct fan-out via patterned conductive layer 20 that minimizes the surface area and volume that are required for interconnection of device 40 using finer wiring pitch solution from tape-automated-bonding (TAB) technology as compared to wire bonding. Conventionally, TAB has been used for packaging chips with a high number of pads, for example 400. As shown in FIG. 1D, the idea is to use TAB technology to provide for a smaller number of connections, in the variant shown 16, typically in a range of 4-40 pads, but for power electronic components as devices 40, and not only for signal electronics, and use the TAB technology to provide interconnections for package-free dies and chips. Also, TAB wiring pitches can be about 45 µm using highly conductive Cu, as compared to 80 µm pad pitch with gold ball bonds. Also, Cu is a better conductor, cheaper, stronger, and stiffer than Au. Also, the method allows embedding of bare dies or chips directly into tape 100 without the use of any additional packaging and lead frames.

Next, FIG. 2 shows a stage in a method of manufacturing a flexible printed circuit assembly, in which a tape 100 of an embeddable flexible printed circuit is provided. Tape 100 has first and a second conductive layers 120, 160, and has first and second insulating layers 110, 130, center insulating layer 140, and third and fourth insulating layers 150, and 170, with first insulating layer 110 forming the upper outermost layer of tape 100, and fourth insulating layer 170 forming the lower outermost layer of tape 100. Adhesive layers 112, 114, 132, 142, 152, and 154 are also arranged between the foresaid layers, with adhesive layer 112 being located between the first insulating layer 110 and both the second insulating layer 130 and the first conductive layer 120, with adhesive layer 114 being located between second insulating layer 130 and both first conducting layer 120 and adhesive layer 112; with adhesive layer 132 being located between second insulating layer 130 and center insulating layer 140; with adhesive layer 142 being between center insulating layer 140 and third insulating layer 150; with adhesive layer 152 being located between second conductive layer 160 and third insulating layer 150 and between third insulating layer 150 and adhesive layer 154; and with adhesive layer 154 being located between second conductive layer 160 and fourth insulating layer 170 and between adhesive layer 152 and fourth insulating layer 170. Tape 100 has an overall thickness of $T_2$ that is thicker than thickness $T_1$ of tape 90. $T_2$ can be the final thickness of the assembly 200 if pre-assembled units 95 are fully embedded into opening 180, and is preferably less than 0.8 mm. However, it is also possible that upper surface 11 of insulating layer 10 lies above surface 111.

First and second conductive layers 120, 160 have been patterned, for example with at least a part of first conductive layer 120 forming conductive traces 127, and at least a part of the second conductive layer 160 forming islands 168 and conductive traces 167. Conductive traces 127 have upper surfaces 121 that are exposed and will serve for electrical interconnection, and each have a lower surface 122 that is bonded via adhesive layer 114 to second insulating layer 130. Islands 168 each have an upper surface 161 that is exposed to an opening 180 that is formed in tape 100, and a lower surface 162 that is exposed by opening 175. Also, conductive traces 167 of second conductive layer 160 can be connected to conductive traces 127 through via 164. Opening 180 has been formed from the upper surface of tape 100, and traverses first, second and third insulating layers 110, 130, and 150, middle insulating layer 140, and first conductive layer 120. In a direction along the negative z-axis, opening 180 becomes narrower, with opening 182 at the first insulating layer 110 having a width $W_3$ being the largest width of opening 180 to expose upper surfaces 121 of conductive traces 127 towards the z-direction; with opening 182 having a width $W_2$ at a height of center insulating layer 140 that is narrower than the width $W_3$ to create the main space for accommodating devices; and with opening 182 having a width $W_1$ at a height of the third insulating layer 150 and above upper surface 161 of islands 168 to provide for a thermal interconnection surface with a device.

Opening 182 can be formed by various methodologies, for example by router cutting through first insulating layer 110 and adhesive layer 112 before opening 182 is aligned and laminated over opening 180. Laser ablation techniques can be used, in particular for removing adhesive layers 142, insulation layer 150 and adhesive layer 152. Typically, a range of widths $W_1$, $W_2$, and $W_3$ depends on a size of the device 40 that needs to be embedded plus amount of bending, with width $W_1$ being slightly larger than a width $W_4$ of device 40, for example $W_1$ being about 200 µm to 10,000 µm wider than width $W_4$ device 40.

Figures 3, 4:
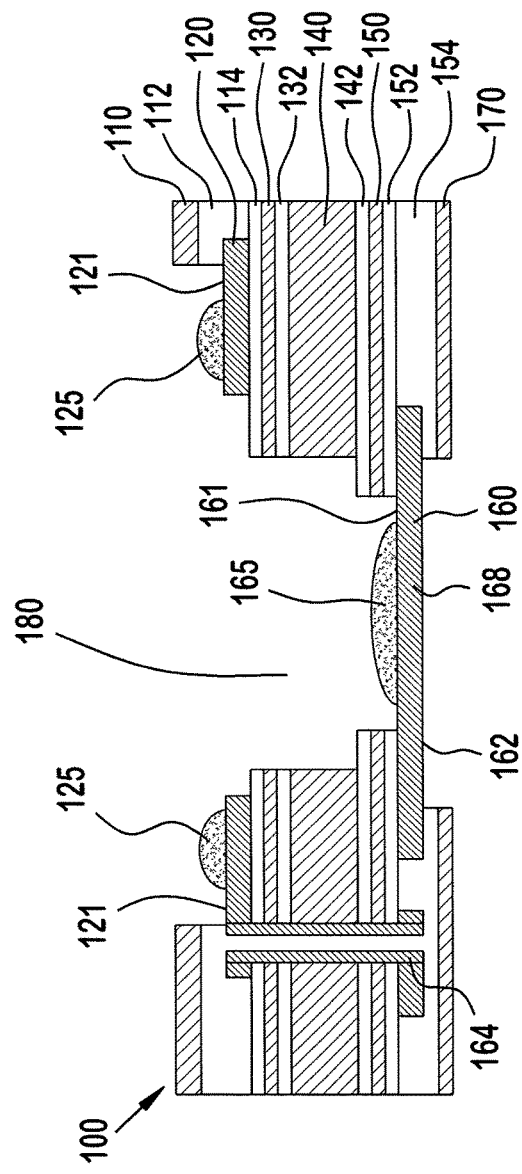

FIG. 3 shows a stage in a method of manufacturing a flexible printed circuit assembly, in which tape 100 has been prepared for attaching pre-assembled units 95 into opening 180. For this purpose, conductive attachment material 125 such as but not limited to lead-free solder or anisotropic conductive film (ACF) is deposited onto upper surface 121 of each of conductive traces 127. In addition, a thermally conductive adhesive 165 is deposited on an upper surface 161 of island 168 for later creating a thermal bond with device 40. Preferably, conductive attachment material 125 and thermally conductive adhesive 165, such as an epoxy adhesive or solder paste, is dispensed onto surfaces with pressurized needle syringes to dispense fixed volumes of viscous fluids. Adhesives 112, 114, 132, 142, 152 and 154 have hotter operating temperatures than the solder reflow or epoxy cure temperature so that hot processes do not damage flex tape 100.

FIG. 4 shows a stage in a method of manufacturing a flexible printed circuit assembly, in which pre-assembled units 95 has been flipped and then placed into openings 180 of tape 100. This step can be performed by a pick-, flip-, and place-apparatus. During this step, units 95 are placed into openings 180 such that all pads of units 95 are aligned to copper pads 127 of tape 100. Opening 180 can be formed such that a distance D2 is preferably in a range between 100 µm to 2000 µm, more preferably between 100 µm and 500 µm. However, it is not necessary that device 40 is centered inside cavity. Device 40 may be places closer sidewall 141 that is next to through via 164 since area around through via 164 of tape 100 is stiffer, and can be more remote from the remaining three (3) sidewalls 141. Also, thermally conductive adhesive 165 is spread out by virtue of the pressure in the negative z-direction from lower surface 42 of device 40, so that the upper surface 161 of island 168 directly under device 40 is covered with thermally conductive adhesive 165, and also at least portions of sidewalls 152 of third insulating layer 150. Moreover, conductive attachment material 125 will form bonds and electrical connections between upper surface 121 of conductive traces 127 that are formed from first conductive layer 120 and lower surface of connection portions 25 of traces 22. Preferably, the entire unit 95 is arranged such that it is fully embedded inside opening 180, so that there is a distance D1 between upper surface 11 of insulating layer 10 and upper surface 111 of first insulating layer 110 of tape 100. By inserting unit 95 into opening, a space 189 is formed around device 40, between lateral sidewalls 44 of device 40 and sidewalls 141 that form opening 180.

Figure 5:
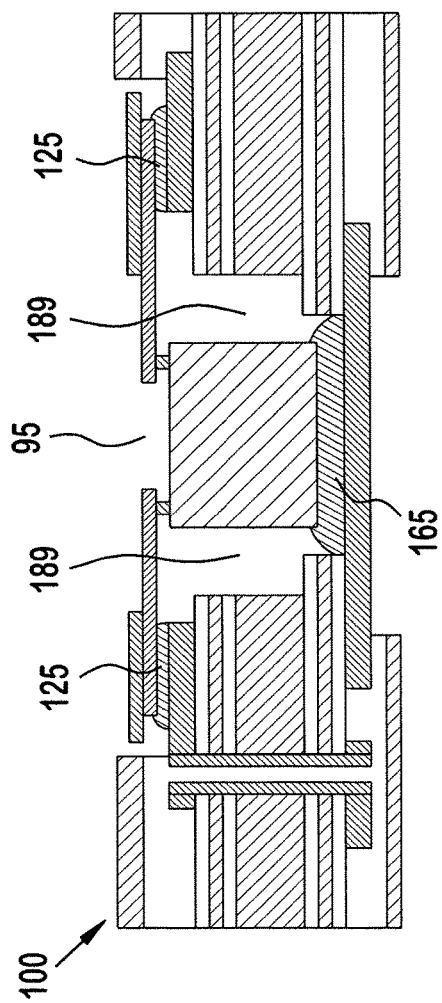

Next, FIG. 5 shows a stage in a method of manufacturing a flexible printed circuit assembly, in which conductive attachment material 125 has been connected to first conductive layer 120 and conductive layer 20, for example by reflow soldering, and the thermally conductive adhesive 165 is cured for a fixed attachment of pre-assembled units 95 to tape 100. Preferably, both solder reflow of attachment material 125 and adhesive 165 cure are performed at the same time with the same thermal process. For attachment material 123, lead-free solder reflow processes are known with ramp to peak temperature above 250° C. Epoxy can be used for adhesive 165 and volatile gases can be removed from adhesive 165 during a temperature ramp up to stabilize the organic mixture, and then be cured during the temperature ramp down from 150° C. to 80° C. of the same thermal process. When using polyimide adhesives, it is possible to use solder with hotter melting temperatures like SnAg having reflow temperature that peaks briefly at 330° C. Die attach solder can be used for adhesive 165 that is lead-free solder melting below 230° C. Therefore, attachment material 125 can be attached first, and then adhesive 165 connections with device 40 are made during the long ramp up and cool-down process.

Figure 6:
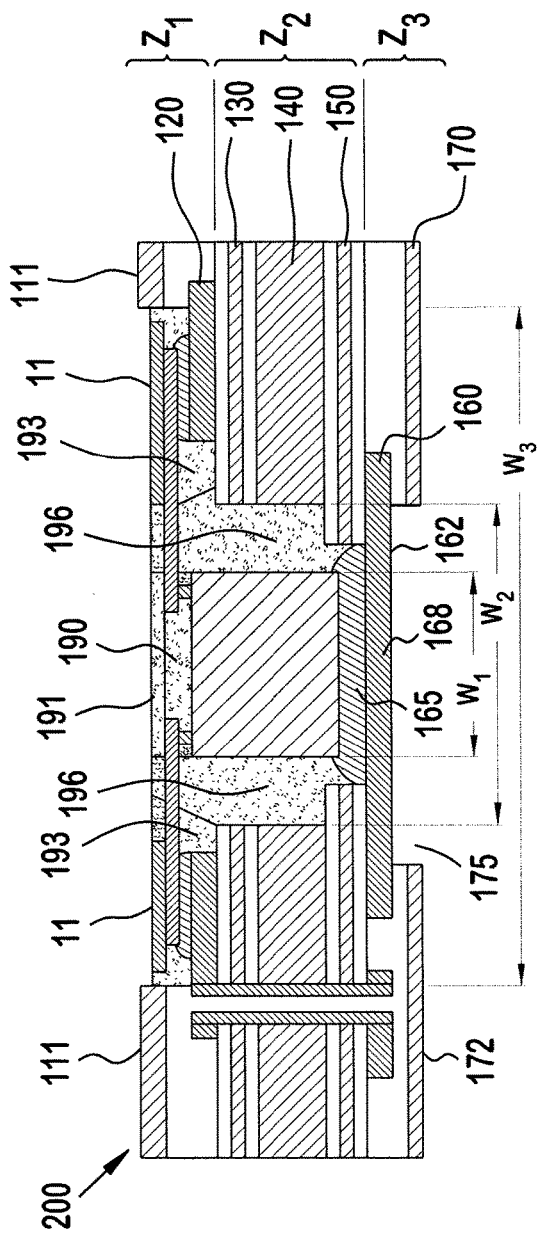

FIG. 6 shows a stage in a method of manufacturing a flexible printed circuit assembly 200, in which spaces 189 have been filled by an encapsulating material 190 to further attach unit 95 with device 40 within opening 180 of tape 100. To adjust the stiffness profile of tape 100, two different encapsulation materials can be dispensed. A stiff underfill 190 with filler particles can be dispensed over device 40 can be used to protect connections 30, for both chip and TAB bonds. A less stiff encapsulant 193 is dispensed to join tape 100 to secure around all joints formed by attachment material 125. An elastic, jell material 196 or partial air gap to fill spaces between device 40 and four middle sidewalls 141. Also, encapsulant material 190 is chosen to have a coefficient of thermal expansion (CTE) that matches the TAB bonds, copper and solder joints 125. Underfill 190 on top of device 40 can be chosen to have CTE between Si and Cu. Underfill 193 around solder joints 125 can be chosen to have CTE between Cu and solder. Jel has low modulus and high elongation than polyimide. Jels can be filled with Silicon Dioxide ($SiO2$) particles to increase heat transfer from all sides 44 of device 40. In this step, spaces 189 have been filled with a jel filler material that is subsequently cured by ultraviolet (UV) radiation or a heat curing process. The jel filler material will protect device 40 electrically from solder and flux residues, and from mechanical stresses. Also, in a cured or hardened state, encapsulating material 190 provides additional stiffness to assembly 200, so that a stiffness at the location of spaces 189 is increased. In a cured or hardened state, a stiffness of encapsulating materials is chosen to be in a range of 0.1 to 10 GPa. Moreover, the depth in z-direction, the widths $W_1$, $W_2$, and $W_3$, and the lengths in the x-direction of openings 180, as well as the amount of encapsulating material 190, are designed and chosen such that devices 40 of different dimensions can be accommodated into openings 180, and still maintain excellent thermal connections with islands 168. Spaces 189 are filled such that encapsulating material 190 reaches an upper surface 11 of insulating layer 10 of pre-assembled unit 95.

In a variant, it is also possible that encapsulating material 190 is arranged to be flush with an upper surface 111 of first insulating layer 110. In another variant, a relatively stiff encapsulating material 190 is dispensed over device 40 to protect connections 30 and to reach at least conductive layer 20, but can also be arranged to surround side walls 44 of device 40, and next, a less stiff flexible jel 196 can be used to fill the remaining cavities of spaces 189, also the spaces around connections 125.

FIG. 6 also shows simplified compressive/tensile stress zones $Z_1$ and $Z_3$ when assembly 200 is subject to bending, and a neutral zone $Z_2$ that is subject to less or no forces when assembly 200 is subject to bending, defined as areas along the z-direction. These zones can be more complex in reality for example if multiple air gaps are present. While center insulating layer 140 and second and third insulating layers 130, 150 are arranged in the neutral zone $Z_2$, first insulating layer 110 and first conductive layer 120 are arranged in compressive/tensile stress zone $Z_1$, and fourth insulating layer 170 and second conductive layer 160 are arranged in compressive/tensile stress zone $Z_3$. Opening 180, the thickness of center insulating layer 140 and second and third insulating layers 130, 150, as well as the dimensions of device 40, can be chosen such that device 40 lies entirely within neutral zone $Z_2$, so that device 40 is minimally exposed to tensile and compressive forces during bending. A ratio between the thickness of the zones $Z_1$, $Z_2$, and $Z_3$ can be considered to be about 3:6:3. In a variant, first insulating layer 110 and adhesive layer 112 can be made thicker, and first conductive layer 120 can be made thinner relative to the other layers, so that the level of interconnections 30 and conductive attachment material 125 is arranged in the neutral zone $Z_2$, so that connection traces 20 are less subject to bending forces when assembly 200 is bent.

Moreover, FIG. 7A shows a graph representing the stiffness profile along a y-direction of tape 100 as shown in FIG. 5, with unit 95 inserted but without any encapsulating material in spaces 189, showing the average stiffness $Y_t$ along tape 100 where no devices 40 are arranged, a minimal stiffness $Y_{min}$ in an area between side walls 44 of device 40 and sidewalls 162 of center insulating layer 150 where the spaces 189 are arranged, and a maximal stiffness $Y_{max}$ along device 40. Due to minimal stiffness $Y_{min}$ at spaces 189 without any additional measures, in the case where tape 100 would be subject to bending, most of the bending would happen at spaces 189 so that conductive traces 22 could detach from traces 127, and device 40 could detach from islands 168. Also, it is possible that tape 100 could be subject to micro-cracks and tearing.

Next, FIG. 7B shows a graph representing the stiffness profile along a y-direction of assembly 200 as shown in FIG. 6, including tape 100 with unit 95 inserted and with the cured or hardened encapsulating material 190 applied. As shown in this stiffness profile, instead of having a stiffness drop at locations where spaces 189 are arranged from average stiffness $Y_t$ to a minimal stiffness $Y_{min}$, the stiffness continuously increases without any decrease from average stiffness $Y_t$ to maximal stiffness $Y_{max}$ where device 40 is arranged. This allows prevention of the tendency of increased bending at locations of spaces 189, and will shift the smallest bending radius toward areas where no devices 40 are arranged, because areas where units 95 and devices 40 are arranged will be stiffened. Bending forces are shifted away from devices 40 that can be brittle, such as bare semiconductor chips by the local stiffening. Openings 189 can be fully filled to prevent or reduce bending, but can be partially filled to allow bending of jel or air gap between sidewall 44 of device 40 and sidewalls 141 of tape 100. However, in a variant, it is also possible to devices 40 are bendable themselves, for example by placing organic chips or ultrathin silicon chips into opening 180. Ultrathin chips can have a thickness in a range of 15 μm to 50 μm, instead of conventional chips having a thickness of approximately 400 μm. For example chips made of Chipfilm™ technology of IMS Chips could be used. Devices 40 can be attached with bumps or pillars as connections 30 that are taller than the thickness of device 40.

The resulting flexible printed circuit assembly 200 as shown in FIG. 6 and its method of manufacturing as described above provides a very cost-effective way of connecting device 40 with other circuits by embedding devices 40, such as bare chips or dies, into a flexible printed circuit tape 100, by using pre-assembled units 95 that are flexible themselves. Assembly 200 combines the use of single copper layer flexible printed circuits of tape 90 with the multiple copper layers flexible printed circuits of tape 100. Moreover, in light of its thin thickness $T_2$ and exposure of lower surface 162 of islands 168 as a heat-dissipating surface, thermal energy can be effectively dissipated from both the upper and lower side of the assembly, i.e., from upper surface 111 of first insulating layer 110, upper surface 191 of encapsulating material 190, lower surface 172 of fourth insulating layer, and lower surface 162 of island 168. The lowest thermal resistance exiting from device 40 to the environment is encountered via islands 168, and therefore lower surface 175 of each island 168 can also be connected to a further heat sink structure, by using a thermally conductive adhesive or thermal grease.

One possible application of the above is the embedding of power IC chip into tape 100. Other examples are memory, smart power analog-mixed signal ICs, freewheeling diodes, integrated passive devices (IPD), resistors, battery, sensors, MEMS and capacitors. Devices consuming a relatively large amount of power, operating at high voltages and therefore produce thermal energy requiring dissipation are envisioned. Also, assembly 200 can be entirely made of materials and devices that can be operated at high temperatures, above 300° C. For example, by choosing high temperature materials for the insulating layers 110, 130, 140, 150, and 170, typically high-temperature polymers, metal such as copper for the conductive layers 120, 160, high temperature adhesives for adhesive layers 112, 114, 132, 142, 152, and 154 such as polymers and silicone based adhesives, semiconductor technology for devices 40 that operate at high temperatures, typically Silicon Carbide (SiC) devices, and Gold-Tin (Au—Sn) eutectic alloys for connections 30 and conductive attachment material 125, combined with the large heat-dissipation capabilities and low thermal resistances, the assembly can be operated at high temperatures, which allows production of low-cost power circuits that can be made having a large surface area.

Assembly 200 can be attached to other devices, that serve as a heat sink, for example bent sheet metal of an automobile. This can be done by filling openings 175 at lower surface 162 of islands 168 with a conductive paste, and then lower surface 172 of fourth insulating layer 170 can be bonded to the heat sink, such that the bonding layer is very thin to provide a low thermal resistance between islands 168 and the heat sink.

Figure 8A:
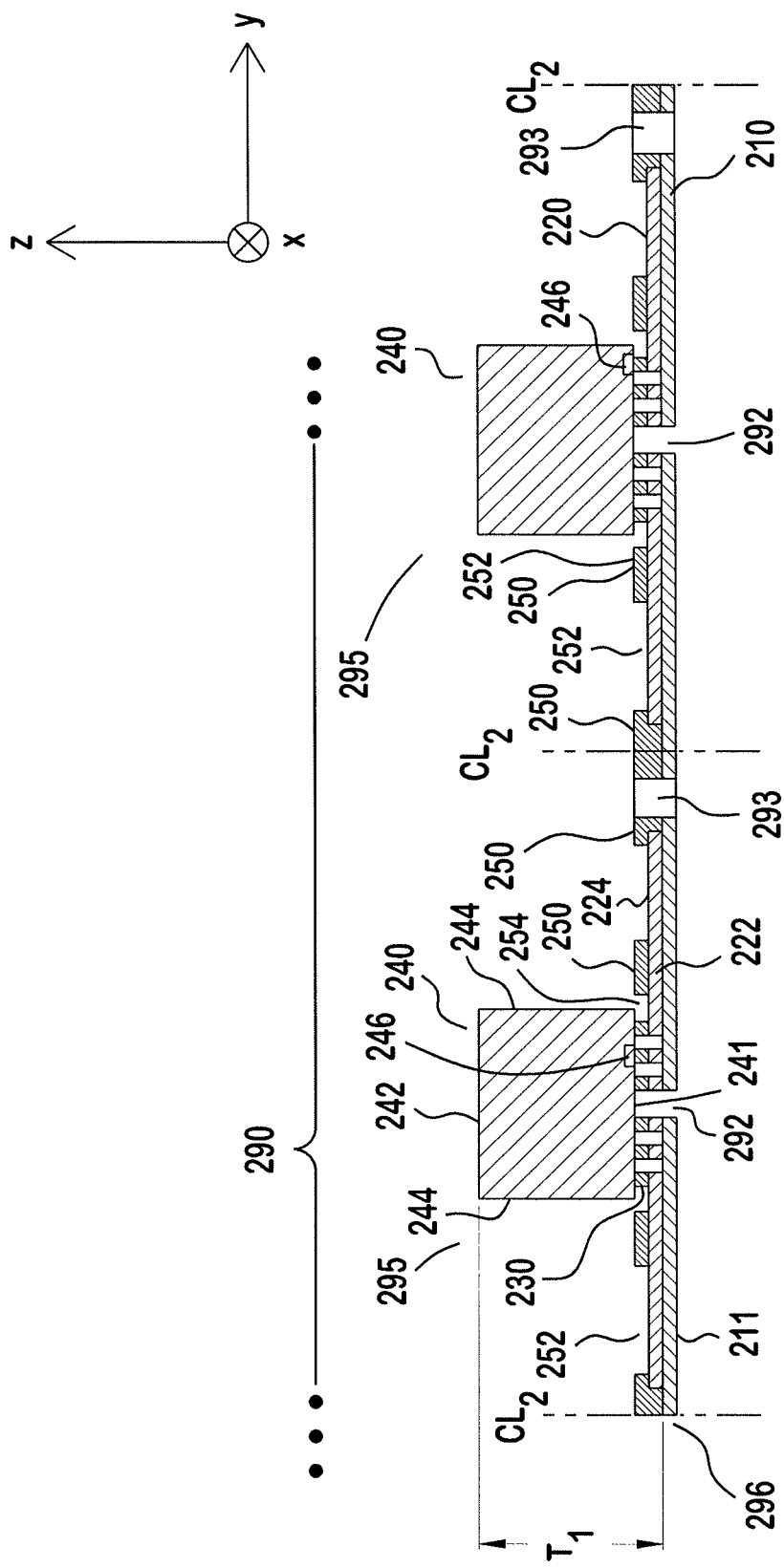
FIG. 8A shows a side cross-sectional view and FIG. 8B shows a top view of a pre-assembled flip-chip bonded single-sided flexible printed circuit tape according to another aspect of the present invention.
Figure 8B:
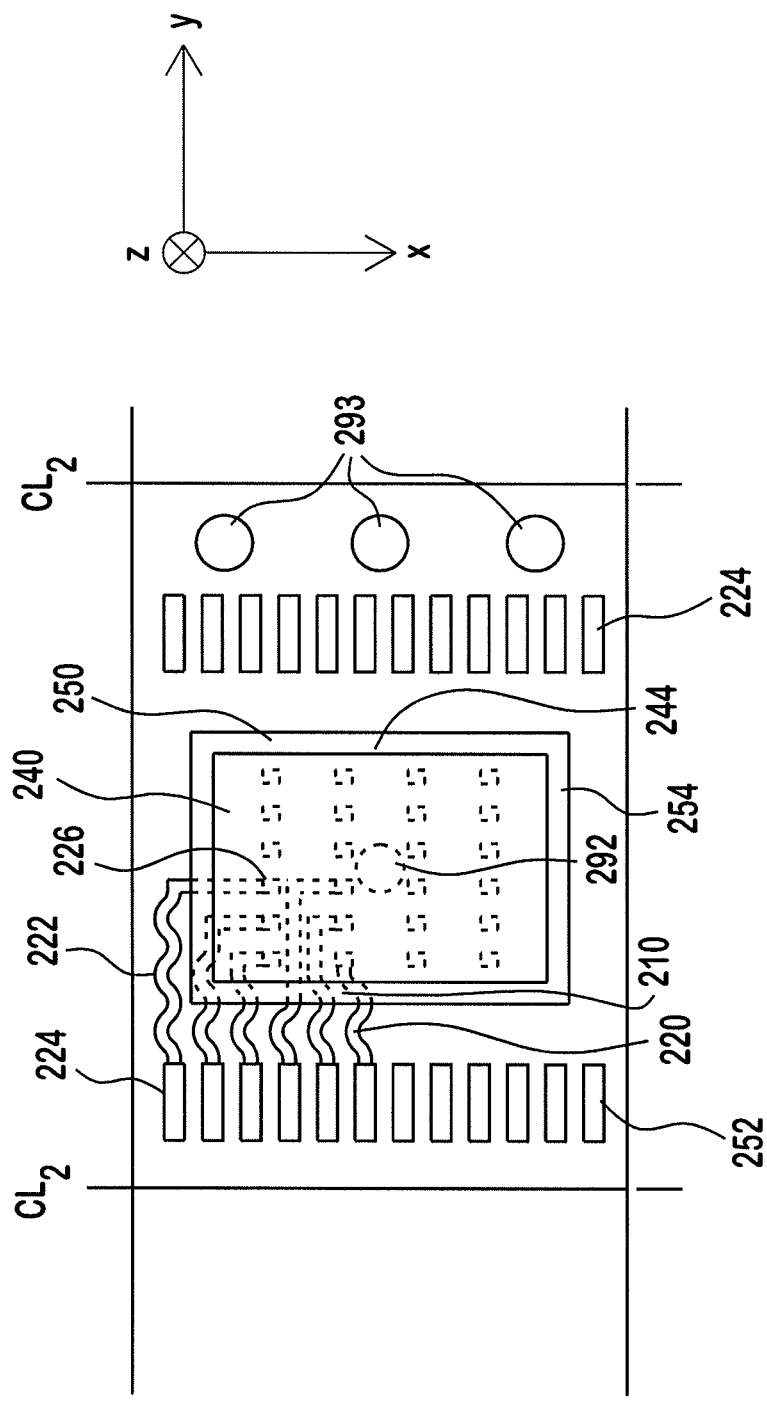

Next, FIG. 8A shows a side cross-sectional view and FIG. 8B shows a top view of a pre-assembled single metal layer flexible printed circuit tape 290 in a flip-chip configuration having two components 240 attached thereto, and FIGS. 9-14 show stages of a method to manufacture a flexible printed circuit assembly 400, according to another embodiment of the present invention. Sub-assembly tape 290, also called flip-chips on flex (FCOF) sub-assembly tape 290 includes a plurality of pre-assembled units 295 that are delineated by cutting lines $CL_2$, and is pre-manufactured by using flexible printed circuit 296 that includes an insulating layer 210 as a carrier tape, a conductive layer 220 with conductive traces 222 and interconnection pads 240. Moreover, upper surface of conductive layer 220 is partially covered with a solder mask or coverlay 250 having openings 252 and 254 for pads 224 and pads 226 for interconnection with terminals 246 of flip-chip device 240, respectively. Heat is transferred through terminals 246 and flip-chip bumps 230 into conductive layer 220. Although chip separation from conductive layer 220 is typically less than 100 μm, the diameter of solder balls is small, thermal conductivity of solder material is not as good as Cu if Cu is used as a material for conductive layer 220, Cu traces can be made thin and narrow to function as heat conduction paths away from device 240. Better path to evacuate thermal energy is via the backside of chip 240. Device 240 is usually a chip made of silicon material having excellent heat conductivity and much larger surface area. This allows to flip-chip power devices 240 into opening 380 with the lower surface of device 240 being in connection with islands 368 for very low thermal resistivity towards the negative z-direction.

Also, flexible printed circuit 296 has an inner hole 292 arranged substantially at the center of each unit 295 of the tape 295 and has outer holes 293 arranged at the right end of unit 295, remote from the location of flip-chip device 240. Preferably, holes 293 are arranged in two lines both the right and the left side of unit 295 between cutting lines $CL_2$ and pads 224, or in a case where pads 224 are arranged on all four (4) sides of unit 295, in four lines around the unit 295. Inner hole 292 can be arranged at different locations on flexible printed circuit 296, as long as it allows the introduction of underfill via the hole 292. Underfill seeps through hole 292 and spreads out to fill cavities between device 240, bumps and flexible printed circuit 296. As shown in FIG. 8B, it is possible to arrange multiple outer holes 293 along the x and y-axes. In a variant, outer holes 293 are formed as cut-outs that create a cavity in the edge defined by cutting line CL2. Device 240 has been flip-chip bonded to pads 226 of conductive layer 220 with interconnection elements 230, for example solder bumps. As shown in top view of FIG. 8B, a surface area of a pad 224 is made substantially larger than a surface area of pad 226 for interconnection with terminals 246 of flip-chip device 240. Moreover, conductive traces 222 are shown to be arranged to be straight in the y-direction, with some of them being straight to the x-direction to pads 226. However, in a variant, they can be made as undulated traces 222 that can be stretched and compressed without tearing or cracking, and act like springs that will lower the mechanical stresses when assembly 400 will be subject to bending and flexing, as shown in FIG. 1C.

Next, FIG. 9 shows a stage in a method of manufacturing a flexible printed circuit assembly 400, in which tape 300 of a double-sided flexible printed circuit is provided, being very similar to tape 100 shown in FIG. 2. A difference between tape 100 and tape 300 is the arrangement of opening 383 on the positive y-direction side (right side) having a width $W_7$ that is wider than a width $W_6$ of an opening 382 on the negative y-direction side, so that the outer holes 293 of unit 295 can be accommodated. Analogous to tape 100, tape 300 has a first and a second conductive layer 320, 360, first and second insulating layers 310, 330, center insulating layer 340, and third and fourth insulating layers 350 and 370, with first insulating layer forming the upper outermost layer of tape 300, and fourth insulating layer 170 forming the lower outermost layer of tape 300. Adhesive layers 312, 314, 332, 342, 352, and 354 are also arranged between the foresaid layers, with adhesive layers arranged as explained above with respect to FIG. 2. Tape 100 has an overall thickness of $T_2$ that is thicker than thickness $T_1$ of tape 90. Thickness $T_2$ usually also forms the final thickness of assembly 400, and is preferably less than 0.8 mm.

Also, analogously as shown in FIG. 2, first and second conductive layers 320, 360 have been patterned by manufacturing steps, for example at least a part of first conductive layer 320 forming conductive traces 327, and at least a part of the second conductive layer 360 forming islands 368 and conductive traces 367. Conductive traces 327 have upper surfaces 321 that are exposed and will serve for electrical interconnection, and have lower surfaces 322 that is bonded via adhesive layer 314 to second insulating layer 330. Islands 368 have upper surface 361 that is exposed to an opening 380 that is formed in tape 300, and has a lower surface 362 that is exposed by opening 375. Also, conductive traces 367 of second conductive layer 360 can be connected to conductive traces 327 of first conductive layer 320 via a through via 364. Opening 380 has been formed from the upper surface of tape 300, and traverses first, second and third insulating layers 310, 330, and 350, middle insulating layer 340, and first conductive layer 320. In a direction along the negative z-axis, opening 380 becomes narrower, with opening 382 at first insulating layer 310 having a width $W_{10}$ being the largest width of opening 380 to expose upper surfaces 321 of conductive traces 327 towards the z-direction, having a width $W_9$ at a height of center insulating layer 340 that is narrower than the width $W_{10}$ to create the mains space for accommodating devices, and having a width $W_8$ at a height of third insulating layer 350 and above upper surface 361 of islands 368 to provide for a thermal interconnection surface with a device.

FIG. 10 shows a stage in a method of manufacturing a flexible printed circuit assembly 400, in which tape 100 has been prepared for attaching pre-assembled flip-chip units 395 into opening 380, analogous to FIG. 3. For this purpose, conductive attachment material 325 such as but not limited to lead-free solder or ACF is deposited onto upper surface 321 of conductive traces 327. In addition, a thermally conductive adhesive 365 is deposited on an upper surface 361 of island 368 so that later a thermal bond with device 340 can be created. In a variant, interconnections 230 of pre-assembled flip-chip units 295 are made of a material that has a higher melting point as compared to conductive attachment material 325 if soldering is used for these two conductive attachments, so that interconnections 230 are not damaged or undone once conductive attachment material 325 is molten.

FIG. 11 shows a stage in a method of manufacturing a flexible printed circuit assembly 400, in which pre-assembled units 295 have been placed into openings 380 of tape 300, analogously to FIG. 4. During this step, units 295 are placed into openings 380 such that they are substantially centered in a y-direction inside opening 380. Also, thermally conductive adhesive 365 is spread out by virtue of the pressure in the negative z-direction from lower surface 342 of device 340, so that the entire upper surface 361 of island 368 is covered with thermally conductive adhesive 365, and also at least portions of sidewalls 352 of third insulating layer 350. Moreover, conductive attachment material 325 will form bonds and electrical connections between upper surface 321 of conductive traces 327 that are formed from first conductive layer 320, and pads 224 of traces 222. In the variant shown, unit 395 is arranged such that it is not fully embedded inside opening 380, and there is a distance $D_3$ between upper surface 211 of insulating layer 210 of unit 395, and upper surface 311 of first insulating layer 310 of tape 300. By inserting unit 395 into opening 380, space 389 is formed around device 240, between lateral sidewalls 244 of device 240 and sidewalls 341 that form opening 380. In a variant, tape 290 and tape 300 with opening 380 can be designed such that unit 395 is fully embedded inside opening 380, so that distance $D_3$ would have a negative value.

Next, FIG. 12 shows a stage in a method of manufacturing a flexible printed circuit assembly 400, analogous to FIG. 5 in which conductive attachment material 325 has been connected by reflow soldering and the thermally conductive adhesive 365 have been cured or heat treaded for a fixed attachment of pre-assembled units 295 to tape 300. This step involves ultraviolet (UV) radiation exposure for curing or a heat treatment step. Also, during this step, conductive attachment material 325 has been spread out to cover the entire portion of pads 224 that is not covered by coverlay 250, and has also been spread out to cover a larger part of upper surface 321 of conductive traces 327, to further reduce an electrical resistance formed between conductive traces 327 and 222. Also, thermally conductive adhesive 365 is spread out to cover at least side walls 361 of the third insulating layer 360, to further reduce a thermal resistance from device 240 to the environment.

Figure 13:
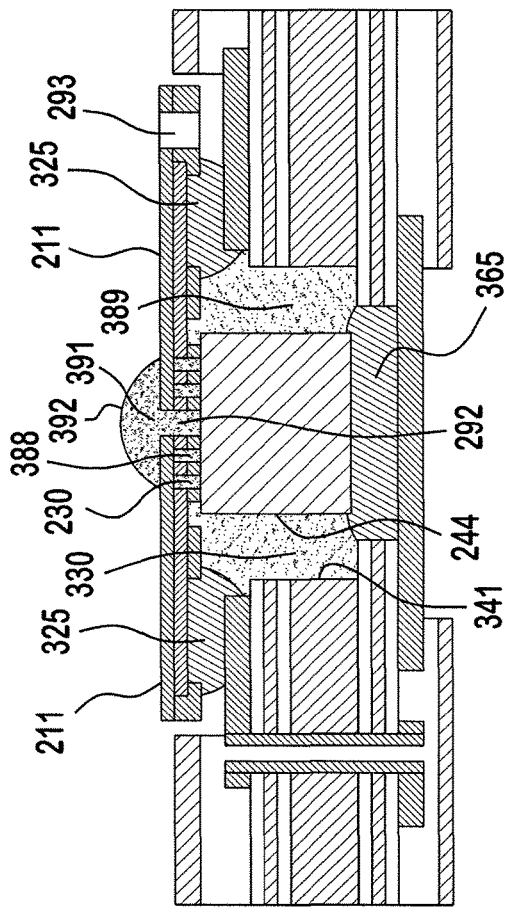

FIG. 13 shows a stage in a method of manufacturing a flexible printed circuit assembly 400, in which areas 388 between device 240 and flexible printed circuit 296 around the interconnections 230 have been filled by an underfill material 391 via inner hole 292. In this step, for example via dispensing apparatus having a syringe, underfill material 391 can be injected via inner hole 292 to fill out areas 388 so that underfill material 391 will enter into an upper area of spaces 389 at an upper area of sidewalls 244. Moreover, it is also possible to prepare pre-assembled units 295 with the underfill 391, before units 295 are placed into opening 380, to increase mechanical strength of interconnections 230, for example solder bumps. These units 295 can also be tested before inserted into opening 380, and has the advantage that it is not necessary to test unit 295 by probing on spherical bumps, such as the ones formed by attachment material 325, but to test via flexible pads 224. Due to the material properties of underfill material 391 and the presence of inner hole 292, a small bulge 392 of underfill material may remain on surface 211 adjacent to inner hole 292. Next, areas 389 between side walls 244 of device 240 and side walls 341 of opening 380 and areas 395 between flexible printed circuit 296 and tape 300 other than the areas above device 240 are filled with encapsulant material 390, for example a jel filler, via the outer holes 293, by using a dispensing apparatus with a syringe. Preferably the jel filler includes filler particles that allow adjustment of the coefficient of thermal expansion (CTE) of encapsulant material 390 to match the CTE of tape 300, and at the same time allows to increase the Young's modulus of encapsulant material 390 to increase stiffness around device 240 also with the goal to either match or even increase stiffness of spaces 389 as compared to the tape 300 including unit 295, as explained above with respect to FIGS. 7A and 7B. For example, silicon-based jel fillers can be used having filler particles that allows to increase the Young's modulus of the rather soft silicon, and can also reduce the CTE that is rather high.

Figure 14:
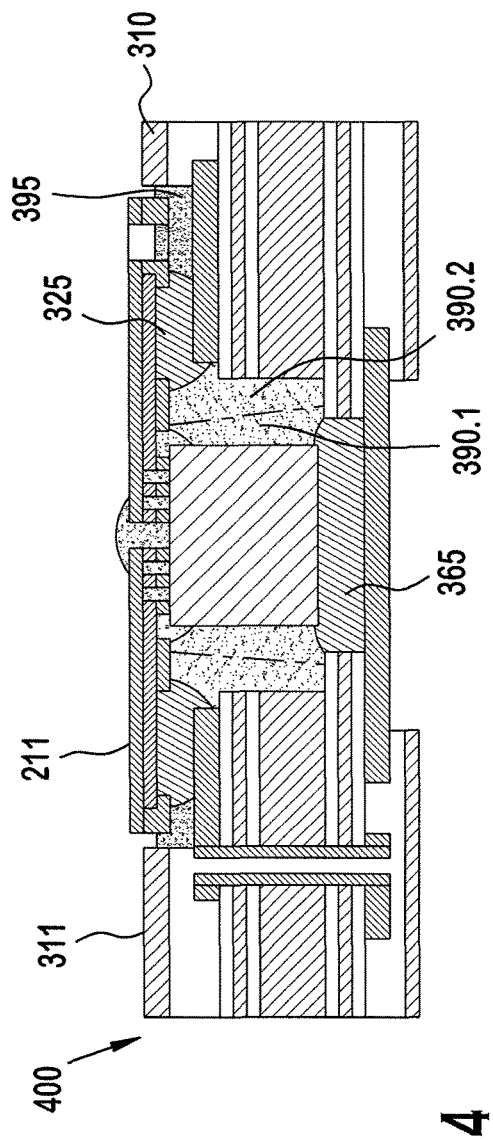

Next, as shown in FIG. 14, when dispensing encapsulant material 390, it is ascertained that few or no cavities remain in areas 389 and 395, and areas 389 and 395 are filled such that encapsulant material closely reaches a level of upper surface 311 of first insulating layer 310. Encapsulant material 390 and underfill material 391 are cured by UV radiation or a heat curing process for hardening and drying. Usually, underfill material 391 is cured and hardened before encapsulant material 390 is filled into 389 and 395. Also, FIG. 14 also shows another variant, in which two different encapsulant materials 390.1 and 390.2 have been used, encapsulant 390.1 closer to wide walls 244 of device 240 being harder, i.e. having a higher Young's modulus, than encapsulant 390.2, to provide for a continuous stiffness profile of assembly along the y-axis.

Assembly 400 presents a novel method of embedding flip-chip devices inside a flexible printed circuit tap 300 that is very thin and allows dissipation of thermal energy from both the upper and the lower side. In addition, despite embedding relatively rigid devices 40, 240, flexibility of tape 100, 300 is maintained, to permit bending radiuses to about 3 cm or less with devices 240 that have a width $W_4$ along the y-direction of less than 4 mm without disconnecting any of the electrical connect ions to device 40, 240, or disrupting the thermal conduction path via islands 168, 368. However, typical x- and y-dimensions of devices 40, 240 are embedded can be as small as 0.3 mm for TAB chips, and as small as 0.5 mm for flip chips, with a tendency that these devices become even smaller. Assemblies 200, 400 also have a thickness $T_2$ that may be thicker than a TAB subassembly, but will be thinner than conventional FCOF. In a variant, instead of having the relatively thick center insulating layer 140, 340 having an exemplary thickness of 100 μm to 150 μm, other electric devices and components, as well as additional wiring can be integrated into assemblies 200, 400. For example, center insulating layer 140, 340 could be replaced by a flexible multilayer printed circuit board, to facilitate interconnection of many terminals and connections between devices 240.1, 240.2, as shown in International Patent Application PCT/US2012/000259, with Publication No. WO/2012/173654, entitled "Flexible Circuit Assembly and Method Thereof," the contents thereof being herewith incorporated by reference. Also, as compared to printed circuit boards (PCB) that are not flexible, assemblies 200, 400 have the advantage that the can be manufactured in a roll-to-roll line manufacturing with tapes 90, 100, 290, 300, and assemblies 200, 400 being rolled and unrolled, thickness can be reduced that permits smaller bending radii that assemblies 200, 400 can be subjected to, and also allows effective heat dissipation from both sides of assemblies 200, 400. Also, the use of flexible printed circuit technology allows to make finer pitches, smaller pads and vias that PCBs, and allow to increase the package density. Also, thereby less bulk raw material has to be used that allows reduction of the overall costs.

Figure 15:
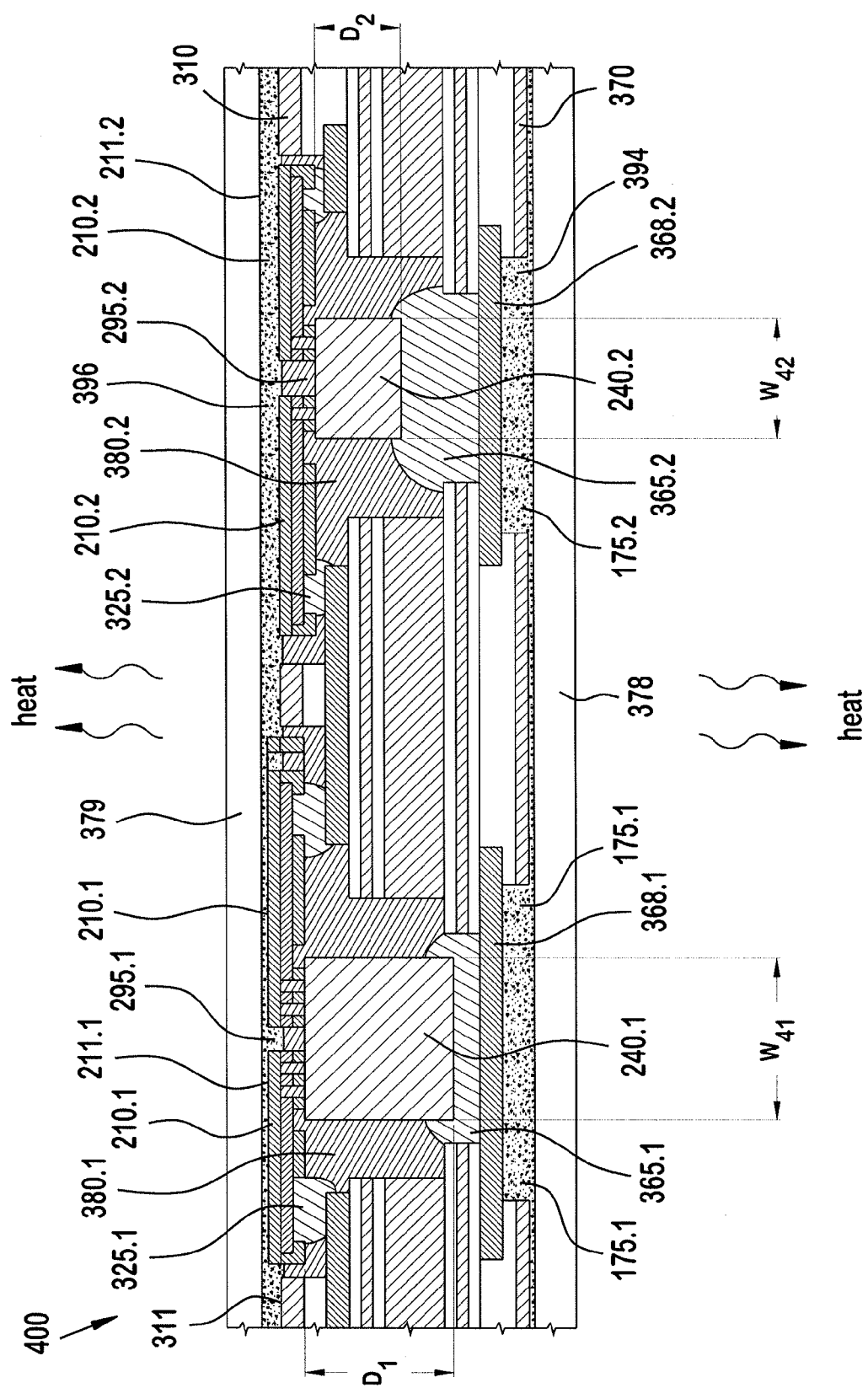
FIG. 15 shows a flexible printed circuit assembly having two different devices embedded therein, according to yet another aspect of the present invention.

FIG. 15 shows an assembly 400 having two devices 240.1 and 240.2 attached to pre-assembled units 295.1 and 295.2, respectively, located in respective openings 380.1, 380.2 of tape 300. Device 240.1 has a width $W_{41}$ that is larger than width $W_{42}$ of device 240.2, and device 240.1 has a depth or thickness $D_1$ that is deeper than depth or thickness $D_2$ of device 240.2. In the variant shown, openings 380.1, 380.2 have substantially the same size and dimensions, but could also be different in size and dimensions. Moreover, assembly 400 is sandwiched between to heat sink layers 378, 379, preferably made of metal such as Al, preferably having a thickness range between 100 μm and 500 μm. Heat sink layers 378, 379 do not need the same thickness. In a variant, only one heat sink layer is arranged, preferably the lower heat sink layer 378. Lower heat sink layer 378 is attached to fourth insulation layer 370, and lower surfaces of islands 368.1 and 368.2, by using a thermal conductive adhesive or grease 394 that forms a layer there between. In addition, upper heat sink layer 379 is attached to first insulation layer 310 and first insulating layer 210 of tape, and also to upper exposed portions of filler material in both openings 380.1 and 380.2, also by using a thermal conductive adhesive or grease 396 that forms a layer therebetween. To compensate for the different depths of thicknesses $D_1$ and $D_2$ of devices 240.1, 240.2, different quantities of adhesives 365.1 and 365.2 can be dispenses over the respective islands 368.1 and 368.2 to insure adhesion and thermal conductivity. With this structure, heat will dissipate from both sides via heat sink layers 378, 379 to the external environment.

For example, this structure can be used to embed different types of semiconductor devices 240.1, 240.2 into assembly 400, for example TAB bonded or flip-chip bonded ones, for effective heat dissipation from both exposed surfaces of heat sink layers 378, 379. By using devices 240.1, 240.2 having relatively small thicknesses $D_1$, $D_2$, for example below 170 μm or even 20 μm with new technologies, it is possible to keep to overall thickness of assembly 400 very low for effective heat dissipation from both sides, and also to preserved the bendability of assembly 400. Also, the height of bumps 325.1 and 325.2 can be variable, preferably in a range between 2 μm and to 100 μm tall stud bumps for stress relief. In addition, the possibility to allow for variable heights of bumps 325.1 and 325.2 allows to adjust the level of pre-assembled units 295.1, 295.2, for example to ascertain that upper surfaces 311, 211.1, 211.2 of insulating layers 310, 210.1, 210.2, respectively, are at the same level to have a substantially planar top surface.

While the invention has been disclosed with reference to certain preferred embodiments, numerous modifications, alterations, and changes to the described embodiments are possible without departing from the sphere and scope of the invention, as defined in the appended claims and their equivalents thereof. Accordingly, it is intended that the invention not be limited to the described embodiments, but that it have the full scope defined by the language of the following claims.

The invention claimed is:

1. A flexible printed circuit assembly, comprising:
   a first flexible printed circuit having a first conductive layer and a device that is connected to conductive traces formed by the first conductive layer; and
   a second flexible printed circuit having a second conductive layer, an insulating center layer, and a third conductive layer, the insulating center layer arranged in-between the second and the third conductive layers, the second conductive layer and the insulating center layer being removed at a predefined location to form an opening to expose an upper surface of the third conductive layer,
   wherein the first flexible printed circuit is arranged such that the device is accommodated inside the opening of the second flexible printed circuit, a lower surface of the device being in thermal connection with the third conductive layer, and the first conductive layer is arranged to be in electrical connection with the second conductive layer,
   the whole device is arranged inside the opening of the second flexible printed circuit;
   the device is located between the first conductive layer and the third conductive layer; and
   the first conductive layer includes a portion extending to the device, and a connection element connects the portion and the device.

2. The flexible printed circuit assembly according to claim 1, wherein the device is attached to the first flexible printed circuit by flip-chip bonding.

3. The flexible printed circuit assembly according to claim 1, wherein a flexibility of the flexible printed circuit assembly allows a bending radius of 3 cm without disconnecting the electrical connection between the first conductive layer and the second conductive layer.

4. The flexible printed circuit assembly according to claim 1, wherein the lower surface of the device and the third conductive layer are connected by a thermally conductive adhesive.

5. The flexible printed circuit assembly according to claim 1, wherein the device includes an IC.

* * * * *